(12) United States Patent
Leobandung

(10) Patent No.: US 10,769,327 B1
(45) Date of Patent: Sep. 8, 2020

(54) INTEGRATED CIRCUIT AUTHENTICATION USING MASK FINGERPRINTING

(71) Applicant: INTERNATIONAL BUSINESS MACHINES CORPORATION, Armonk, NY (US)

(72) Inventor: Effendi Leobandung, Stormville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/440,295

(22) Filed: Jun. 13, 2019

(51) Int. Cl.
    *G06F 17/50*   (2006.01)
    *G06F 30/30*   (2020.01)
    *H04L 12/24*   (2006.01)

(52) U.S. Cl.
    CPC .......... *G06F 30/30* (2020.01); *H04L 41/5054* (2013.01)

(58) Field of Classification Search
    CPC ............................ G06F 30/30; H04L 41/5054
    See application file for complete search history.

(56) References Cited

U.S. PATENT DOCUMENTS

| | | | |
|---|---|---|---|
| 6,738,294 B2 | 5/2004 | Layman et al. | |
| 6,802,447 B2 * | 10/2004 | Horng | G06K 7/10019 235/375 |
| 8,767,445 B2 | 7/2014 | Chellappa et al. | |
| 9,337,837 B2 | 5/2016 | Pfeiffer et al. | |
| 9,442,695 B2 * | 9/2016 | Lobez Comeras | G06F 7/588 |
| 9,502,405 B1 | 11/2016 | Cao et al. | |
| 9,787,480 B2 | 10/2017 | Guo et al. | |
| 9,917,106 B2 | 3/2018 | Cheng et al. | |
| 9,948,470 B2 | 4/2018 | Guo et al. | |
| 9,991,892 B2 | 6/2018 | Wacquez et al. | |

OTHER PUBLICATIONS

D. E. Holcomb et al., "Power-up SRAM state as an identifying fingerprint and source of true random numbers," IEEE Transactions on Computers, vol. 58, No. 9, 2009, pp. 1198-1210.

X. Zhang et al., "Highly stable data SRAM-PUF in 65nm CMOS process," 10th International Conference on ASIC (ASICON), 2013, 4 pp.

(Continued)

*Primary Examiner* — Nghia M Doan
(74) *Attorney, Agent, or Firm* — Cantor Colburn LLP; Vazken Alexanian

(57) ABSTRACT

A method for fabricating a semiconductor chip includes controlling a chip testing device to measure, for each bit of a plurality of bits in the semiconductor chip, mask dimensions for a feature to determine variations of the feature within each bit. Based on the variations a probability of each bit being "0" or "1" is generated to provide predicated probabilities. Based on the predicted probabilities, each bit of the plurality of bits is grouped and a subset of bits is selected to provide a subset of predicted results. The chip testing unit is controlled to measure whether each bit of the subset of bits is in a state is "0" or "1" to provide measured results. The subset of predicted results is compared with the measured results to provide a comparison. Based on the comparison, determination is made that the semiconductor chip has been fabricated using an altered mask.

20 Claims, 7 Drawing Sheets

(56) References Cited

OTHER PUBLICATIONS

Srivatsan Chellappa et al., "SRAM-based unique chip identifier techniques." IEEE Transactions on Very Large Scale Integration (VLSI) Systems, vol. 24, No. 4, 2016, pp. 1213-1222.
Lawrence T. Clark et al., "Physically Unclonable Functions using Foundry SRAM Cells." IEEE Transactions on Circuits and Systems I: Regular Papers, 2018, 12 pp.

* cited by examiner

INTEGRATED CIRCUIT AUTHENTICATION USING MASK FINGERPRINTING

BACKGROUND

The present invention generally relates to authenticating semiconductor-based integrated circuit (IC) wafers. More specifically, the present invention relates to methods, systems, and computer program products that authenticate IC wafers using mask fingerprinting.

In electronic circuit or chip design, a physically unclonable function (PUF) is an identifying characteristic specific to a particular circuit, which can securely and uniquely identify or authenticate the circuit, like a fingerprint. Ideally, the characteristics are stable in time (e.g., resistant to ageing), stable under variations in measurement conditions (e.g., current, voltage and external/environmental measurement conditions such as temperature), and impossible to duplicate physically or mathematically. Any manipulation or modification to the circuit or the chip must also modify these characteristics so that reading this identifier can guarantee integrity of the circuit or the chip.

SUMMARY

Embodiments of the present invention are directed to a method for fabricating a semiconductor chip. A non-limiting example of the method includes controlling a chip testing unit to measure, for each bit of a plurality of bits in the semiconductor chip, mask dimensions for a feature to determine variations of the feature within each bit. Based on the variations, and for each bit of the plurality of bits, predicting a probability of each bit being "0" or "1" is generated in order to provide predicated probabilities. Based on the predicted probabilities, each bit of the plurality of bits is grouped and a subset of bits is selected to provide a subset of predicted results. A chip testing unit measures each bit of the subset of bits to determine a state is "0" or "1" to provide measured results. The subset of predicted results is compared with the measured results to provide a comparison. Based on the comparison, determination is made as to whether the semiconductor chip has been fabricated using an altered mask.

Embodiments of the present invention are directed to a system for authenticating a semiconductor chip. The system includes a processor in communication with one or more types of memory. The processor is configured to control a chip testing unit to measure, for each bit of a plurality of bits in the semiconductor chip, mask dimensions for a feature to determine variations of the feature within each bit. Based on the variations, for each bit of the plurality of bits, a probability of being "0" or "1" is predicted to provide predicated probabilities. Based on the predicted probabilities, each bit of the plurality of bits is grouped, and a subset of bits is selected to provide a subset of predicted results. The chip testing unit measures whether each bit of the subset of bits is in a state is "0" or "1" to provide measured results. The subset of predicted results is compared to the measured results to provide a comparison. Based on the comparison, determination is made that the semiconductor chip has been fabricated using an altered mask.

Embodiments of the present invention are directed to a computer program product for authenticating a semiconductor chip. The computer program product includes a computer readable storage medium readable by a processing circuit and storing program instructions for execution by the processing circuit for performing a method. The method includes controlling a chip testing unit to measure, for each bit of a plurality of bits in the semiconductor chip, mask dimensions for a feature to determine variations in the feature within each bit. Based on the variations, for each bit of the plurality of bits, a prediction is made as to a probability of being "0" or "1" to provide predicated probabilities. Based on the predicted probabilities, each bit of the plurality of bits is grouped, and a subset of bits is selected to provide a subset of predicted results. The chip testing unit is controlled to measure whether each bit of the subset of bits is in a state is "0" or "1" to provide measured results. The subset of predicted results is compared with the measured results to provide a comparison. Based on the comparison, determination is made that the semiconductor chip has been fabricated using an altered mask.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
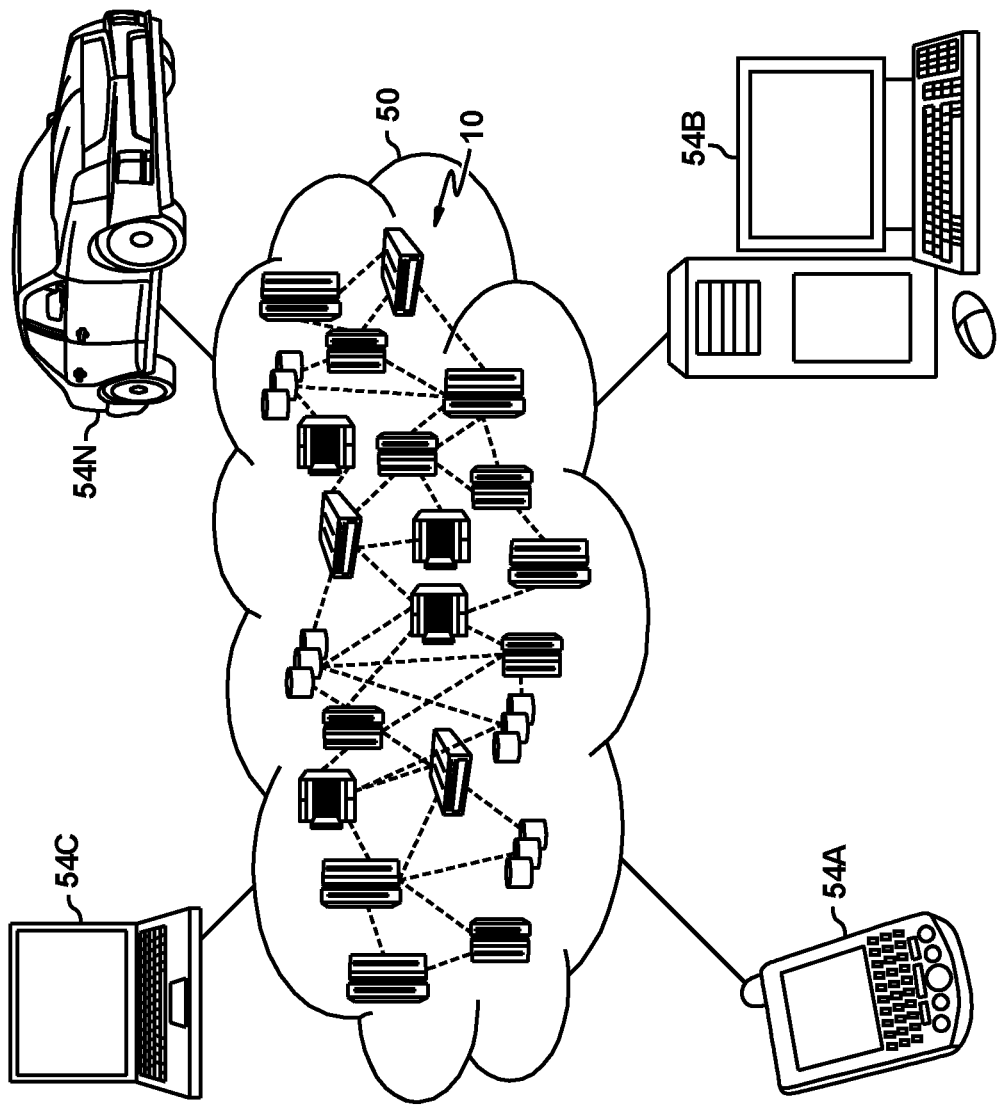
FIG. 1 depicts a cloud computing environment according to embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

It is understood in advance that although this description includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model can include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but can be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It can be managed by the organization or a third party and can exist on-premises or off-premises.

Community cloud: the cloud infrastructure is shared by several organizations and supports a specific community that has shared concerns (e.g., mission, security requirements, policy, and compliance considerations). It can be managed by the organizations or a third party and can exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure including a network of interconnected nodes.

Turning now to an overview of technologies that are more specifically relevant to aspects of the invention, despite complex circuit or chip design protection, malicious entities could still inspect the physical masks of a circuit and use them to reverse engineer the circuit layout. For complex chips, it can be relatively difficult to modify the chip logic functions, even with the mask layout information, and generally, thorough knowledge of the system configuration is needed for a modification. For simple chips, however, it can be possible to modify the logic functions without knowing the overall system configuration. With the mask layout data alone new masks can be generated with added or modified shapes. A hardware Trojan, for example, is a malicious modification of the circuitry of an integrated circuit, which can bypass or disable the security fence of a system.

Turning now to an overview of the aspects of the invention, one or more embodiments of the invention address the above-described shortcomings of the prior art by providing methods, systems, and computer-program products that include fingerprinting one or more masks of a circuit. A chip fabricated by a trusted agent is provided, and dimensions of a particular feature are measured for cell or bit (e.g., gate mask length variations over active areas for each transistor). For each bit, a simulation is performed to determine the probability of being "0" or "1" during device start-up, which is based on the feature variations within each bit. The bits are grouped on a distribution based on the probabilities. Actual measurements are taken for each bit, and the measured data is compared to the simulated data. If the simulated data matches the actual data within a predetermined margin of error, then a user determines that the chip fabricated by the trusted agent has not been altered using an altered mask.

The above-described aspects of the invention address the shortcomings of the prior art by providing methods, systems, and computer-program products that use identifying mask fingerprints to authenticate chips and determine that the chip has been altered.

Turning now to a more detailed description of aspects of the present invention, Referring now to FIG. 1, illustrative cloud computing environment 50 is depicted, according to an embodiment of the present invention. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N can communicate. Nodes 10 can communicate with one another. They can be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 1 are intended to be illustrative only and that computing nodes 10 and cloud computing environment 50 can communicate with any type of computerized device over any type of network and/or network addressable connection (e.g., using a web browser).

Figure 2:
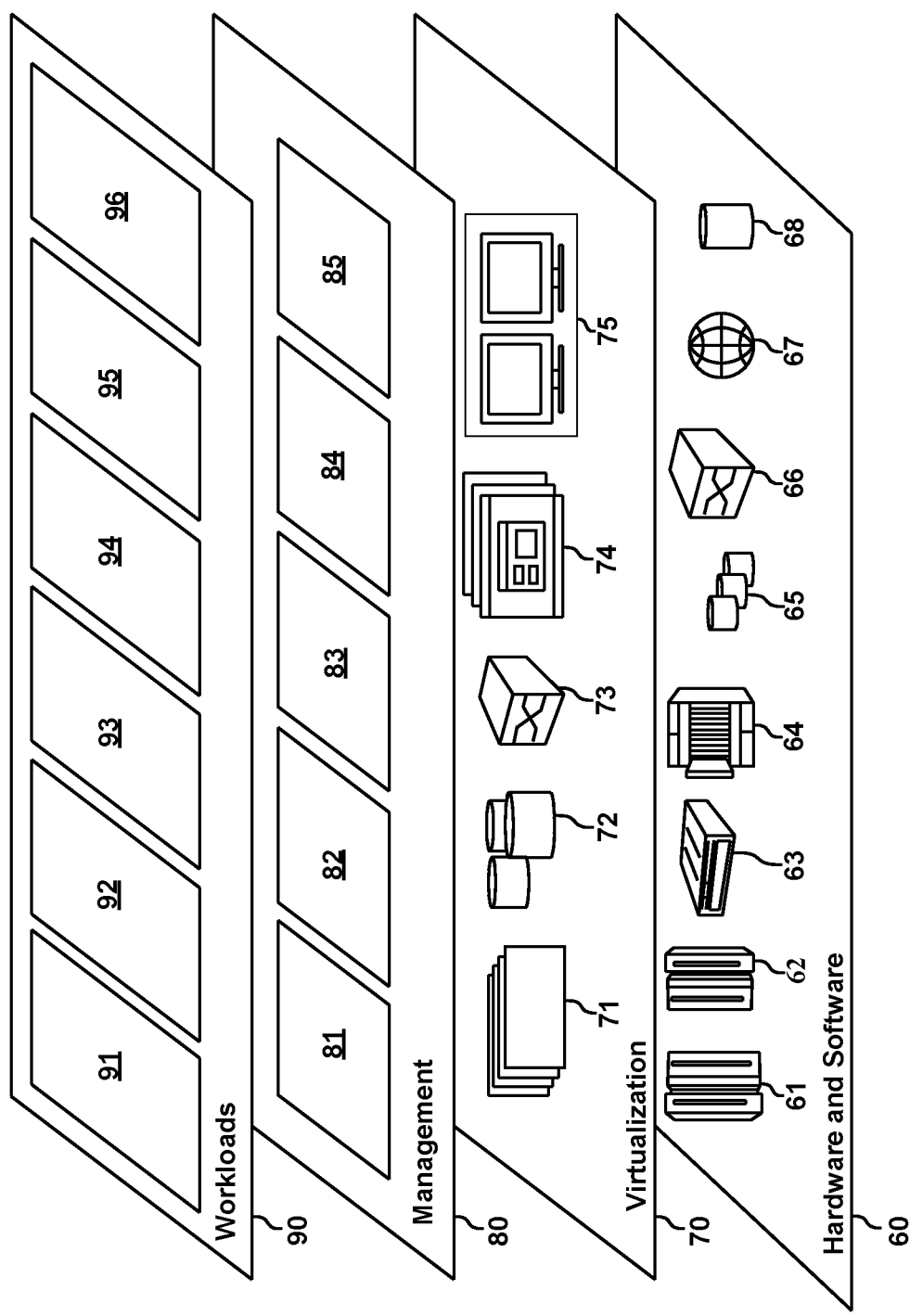
FIG. 2 depicts abstraction model layers according to embodiments of the present invention.

Referring now to FIG. 2, a set of functional abstraction layers provided by cloud computing environment 50 (FIG. 1) is depicted, according to an embodiment of the present invention. It should be understood in advance that the components, layers, and functions shown in FIG. 2 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities can be provided: virtual servers 71; virtual storage 72; virtual networks 73, including virtual private networks; virtual applications and operating systems 74; and virtual clients 75.

In one example, management layer 80 can provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources can include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment can be utilized. Examples of workloads and functions which can be provided from this layer include: mapping and navigation 91; software development and lifecycle management 92; virtual classroom education delivery 93; data analytics processing 94; transaction processing 95; and determining that a semiconductor chip has been altered 96.

Figure 3:
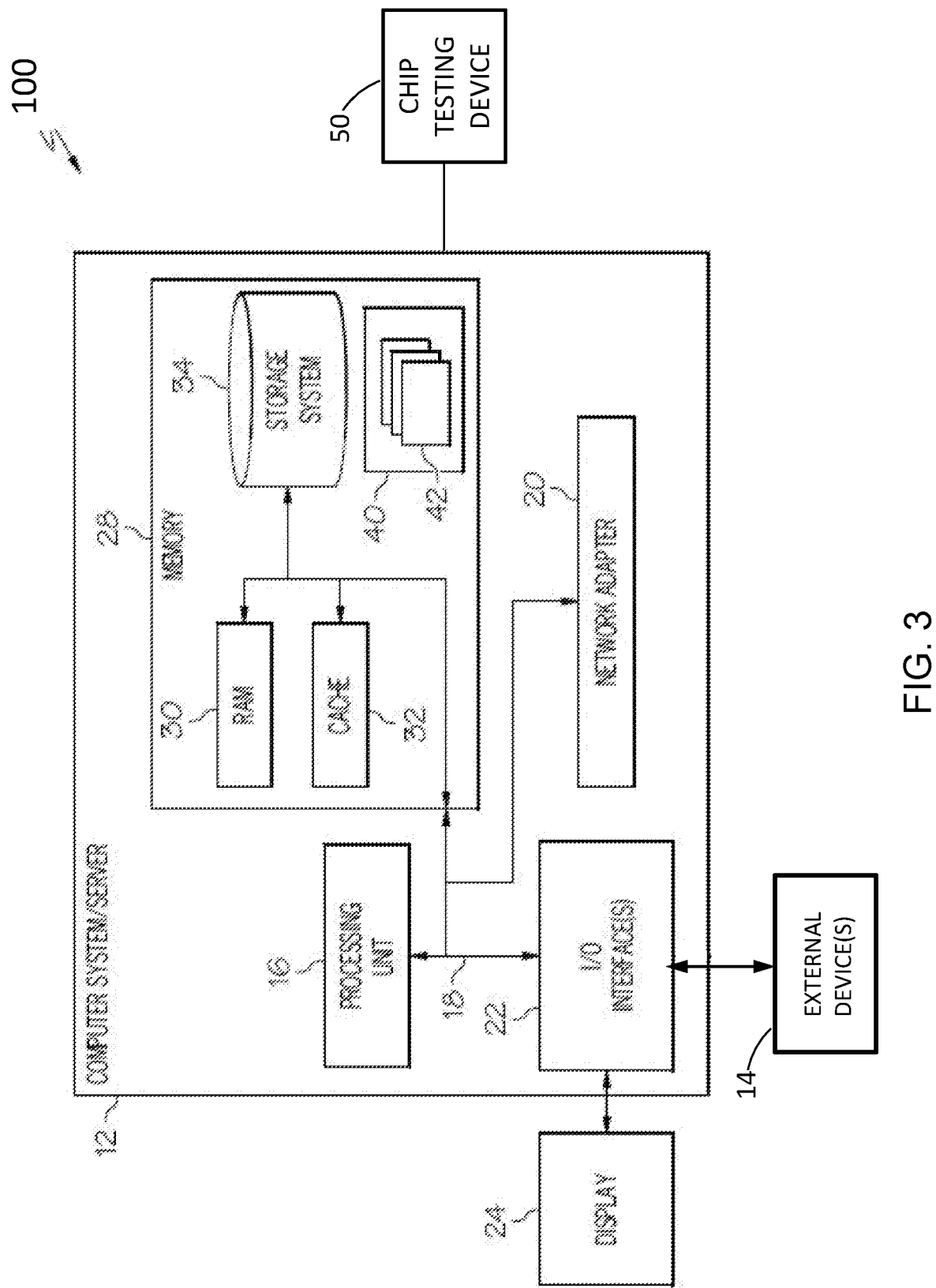
FIG. 3 depicts a computing node according to one or more embodiments of the present invention.

Referring now to FIG. 3, a schematic of a computing node 100 that can be included in a distributed cloud environment or cloud service network is shown according to a non-limiting embodiment of the present invention. The computing node 100 is in communication with chip testing device 50 (also referred to as chip testing unit). The cloud computing node 100 is only one example of a suitable cloud computing node and is not intended to suggest any limitation as to the scope of use or functionality of embodiments of the invention described herein. Regardless, cloud computing node 100 is capable of being implemented and/or performing any of the functionality set forth hereinabove.

In cloud computing node 100 there is a computer system/server 12, which is operational with numerous other general purpose or special purpose computing system environments or configurations. Examples of well-known computing systems, environments, and/or configurations that can be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 can be described in the general context of computer system-executable instructions, such as program modules, being executed by a computer system. Generally, program modules can include routines, programs, objects, components, logic, data structures, and so on that perform particular tasks or implement particular abstract data types. Computer system/server 12 can be practiced in distributed cloud computing environments where tasks are performed by remote processing devices that are linked through a communications network. In a distributed cloud computing environment, program modules can be located in both local and remote computer system storage media including memory storage devices.

As shown in FIG. 3, computer system/server 12 in cloud computing node 100, according to one or more embodiments of the present invention, is shown in the form of a general-purpose computing device. The components of computer system/server 12 can include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media can be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 can further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 can include at least one program product having a set (e.g., at least one) of program modules that are configured to carry out the functions of embodiments of the invention.

Program/utility 40, having a set (at least one) of program modules 42, can be stored in memory 28 by way of example, and not limitation, as well as an operating system, one or more application programs, other program modules, and program data. Each of the operating system, one or more application programs, other program modules, and program data or some combination thereof, can include an implementation of a networking environment. Program modules 42 generally carry out one or more functions and/or methodologies in accordance with some embodiments of the present invention.

Computer system/server 12 can also communicate with one or more external devices 14 such as a keyboard, a pointing device, a display 24, etc., one or more devices that enable a user to interact with computer system/server 12, and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 4:
FIG. 4 depicts a flow diagram illustrating a method for determining that a semiconductor chip has been altered according to one or more embodiments of the present invention.

FIG. 4 depicts a flow diagram illustrating a method 400 for determining that a semiconductor chip has been altered according to one or more embodiments of the present invention. The method 400 includes, as shown in box 402, providing a semiconductor chip that includes a plurality of bits. The semiconductor chip is fabricated by a trusted agent. The semiconductor chip can be a memory chip, a microprocessor, a standard chip, or a complex systems-on-a-chip (SoCs). Non-limiting examples of circuits inside semiconductor chips include a SRAM, latch, NAND (Not-AND), NOR, Comparator, and combinations thereof. Although, the semiconductor chip is not limited to any of these examples and can be any other type of semiconductor chip that includes measurable, masking regions.

The semiconductor chip is can be any size. Although, the more bits per chip, the more secure the chip design. The semiconductor chip includes a 10 kB to 1 MB SRAM according to exemplary embodiments of the present invention.

The method 400 includes, as shown in box 404, measuring, for each bit of the plurality of bits, mask dimensions for a feature to determine variations the feature within each bit. The chip testing device 50 (as shown in FIG. 3) measures the mask dimensions. Non-limiting examples of features include gate dimensions, via dimensions, metal trench/feature dimensions, combinations thereof. Intentional variation can be added to the gate dimension for example, on secrets bits, to enhance the variations.

Figure 6:
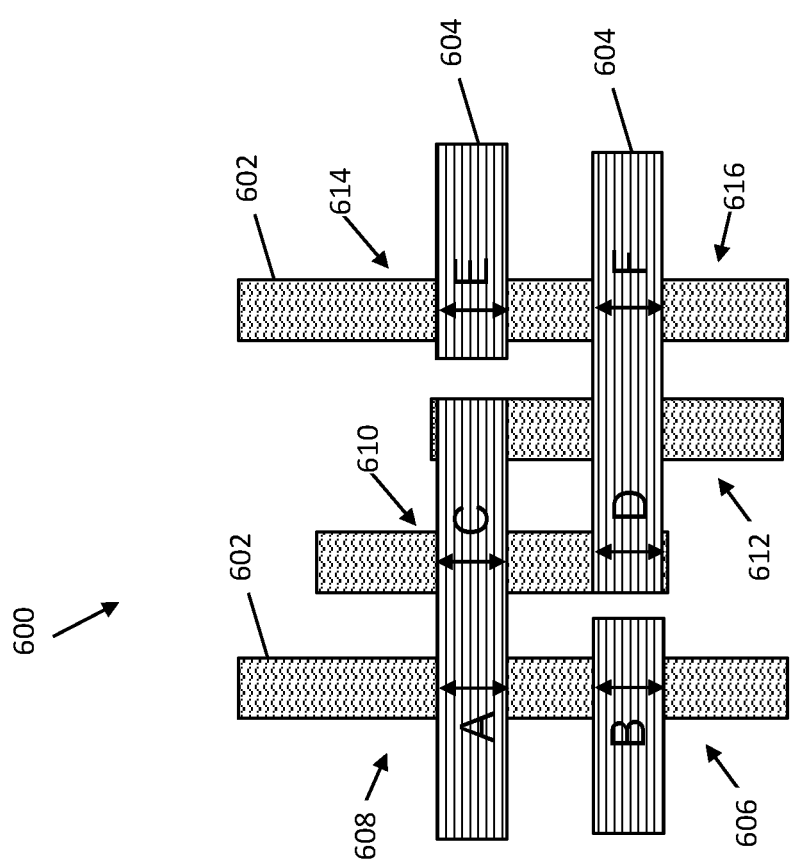
FIG. 6 depicts a static random access memory cell (SRAM) according to embodiments of the present invention.

In some embodiments of the present invention, the variations in the feature can be due to natural, unintended variation that results from imperfect fabrication. For example, variations in gate dimensions over an active area can be measured, as shown in FIG. 6, which depicts a single SRAM cell 600 or bit. The single SRAM cell 600 includes six transistors 606, 608, 610, 612, 614, 616 per bit (or SRAM cell 600). Each transistor 606, 608, 610, 612, 614, 616 includes a gate 604 arranged on and a fin 602. The active area of each transistor 606, 608, 610, 612, 614, 616 is arranged on the fin 602 beneath each gate 604. The portions of the gate 604 over the active areas, which corresponds to the gate mask area, is measured for each transistor 606, 608, 610, 612, 614, 616, and is shown as A, B, C, D, E, and F, respectively, in FIG. 6. The gate mask lengths are measured for each bit (or single SRAM cell 600 in the exemplary embodiments).

In other embodiments of the present invention, the measured variations can be intentional variations in the measured mask area. For example, a gate, via, or metal shape can be intentionally varied in a secret location so that the structure cannot be replicated by an untrusted foundry without being detected during later authentication.

Variation in the measured mask areas for each bit, such as gate mask areas as described above, provides a unique fingerprint that is not easily replicated. If an untrusted or malicious party were to attempt to fabricate a new mask to match the measured gate variation, as illustrated in the example, the chances of matching each bit is low.

The method 400 includes, as shown in box 406, simulating the chip operation to determine, for each bit of the plurality of bits, a probability of being in a state of "0 or 1." The natural variations in the measured mask areas, such as the gate lengths over the active areas of each transistor, results in each bit having a tendency of being in a state of "0" or "1" after the transistor has been initiated. In other words, each bit has a probability of being each of "0" and "1," which depends on the measured mask variations within each bit. Simulations, based on the measured mask dimensions, are performed to simulate the semiconductor chip stability and predict the probability of being "0" or "1" after start-up. The variations in the measured mask feature is therefore used to predict the probability of being "0" or "1."

Each bit of the semiconductor chip will have a probability of being "1" after start-up, and a probability of being "0" during start-up. Probabilities of being "1" or "0" are calculated for each bit of the plurality of bits.

As a non-limiting example, a first bit can have a 90% probability of being "1," and a 10% probability of being "0." A second bit can have a 50% probability of being "1," and 50% probability of being "0." A third bit can have a 10% probability of being "1," and a 90% probability of being "0."

The method 400 includes, as shown in box 408, grouping each bit of the plurality of bits based on the probability and selecting a subset of bits to provide simulated (or predicted) results. After turning on the semiconductor chip, the bits are grouped based on their simulated (or predicted) probabilities. The number of groups can vary and can be a plurality of any number of groups, for example, 2, 3, 4, 5, 6, 7, 8, 9, or 10 groups.

Figure 7:
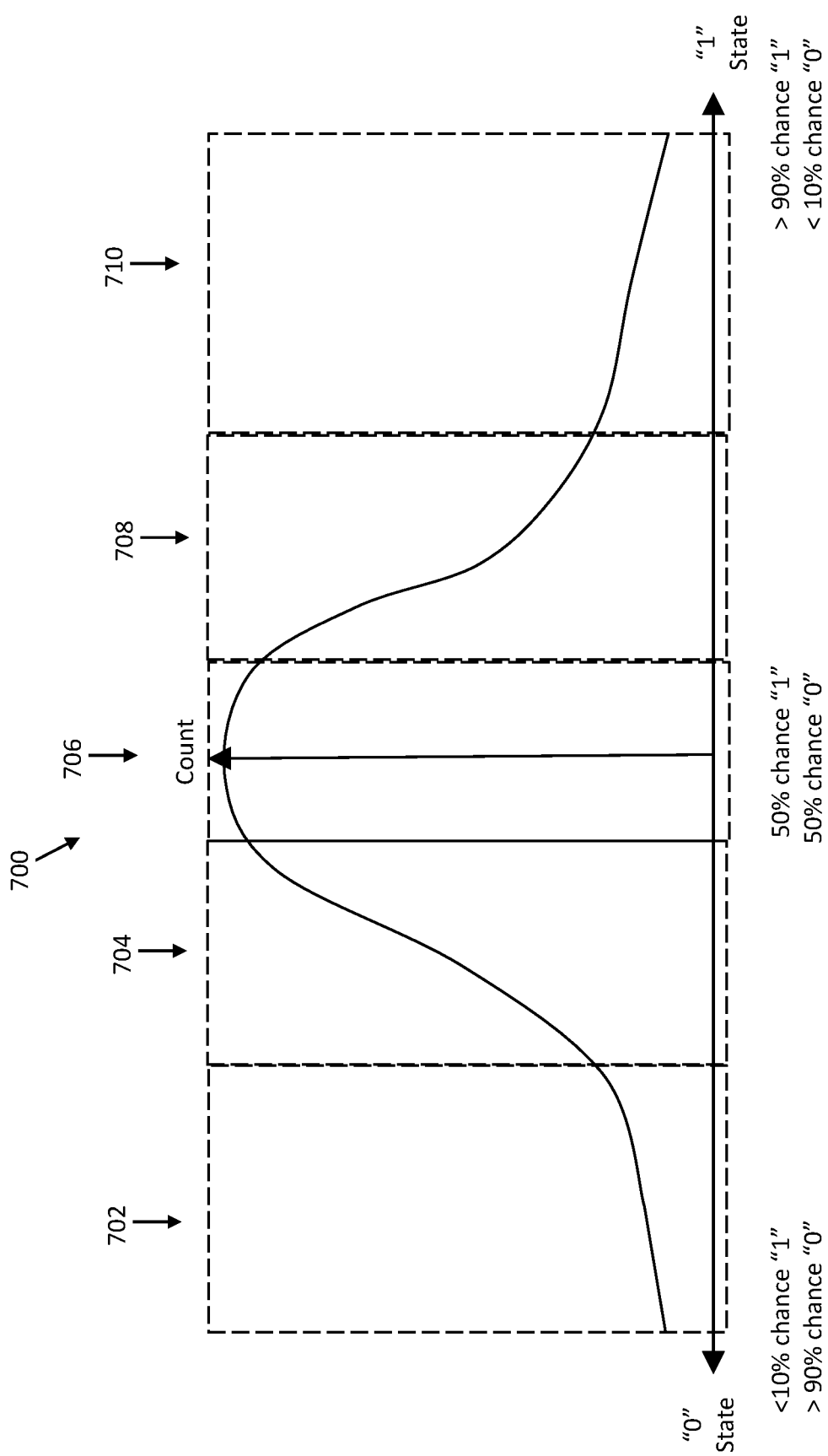
FIG. 7 depicts a probability distribution according to embodiments of the present invention.

The bits can be plotted on a probability distribution, as shown in FIG. 7 for example. The x-axis represents a continuum of a high likelihood of being "0" to a high likelihood of being "1," and the y-axis represents the bit count. FIG. 7 groups the bits into 5 groups, first group 702, second group 704, third group 706, fourth group 708, and fifth group 710. First group 702 has a high probability of being "0," and fifth group 710 has a high probability of being "1." Strong preferences for "0" or "1" in these groups means that the delta in measured feature (e.g., gate length over the active area) is large. For example, when the difference between measured gate lengths is 2 nm, and the measured gate length is 20 nm, such a large difference could be easily replicated by an untrusted malicious source. Therefore, while group 702 and 710 that strongly prefer either "1" or "0" can be used for a fingerprint, they are not as useful for authenticating the semiconductor chip. Third group 706 has a nearly equal probability of being "0" or "1," which means that the measured mask features are too similar and unpredictable, and therefore not deterministic and cannot be used for authentication.

However, second group 704 and fourth group 708, which have a slight preference for "0" or "1" provide useful information because the difference in measured mask features (e.g., delta gate length) is small (e.g., about 0.5-1 nm) and therefore difficult to replicate by an untrusted foundry. Second group 704 has, for example, a 70% probability of being "0," and a 30% probability of being "1." Fourth group 708 has, for example, a 70% probability of being "1," and 30% probability of being "0."

According to one or more embodiments of the present invention, groups of bits that have about 65-85% probability of being either "0" or "1" are selected. According to some embodiments of the present invention, groups of bits that have a probability of at least 65% of being "0" or "1" are selected for the subset of bits.

The method 400 includes, as shown in box 410, operating the semiconductor chip and determining a probability of whether each bit of the subset of bits is in the state of "0" or "1" to provide measured results. The semiconductor chip is turned on, and each bit of the selected subset is measured (by the chip testing device 50, as shown in FIG. 3) to determine whether the bit is "0" or "1." The measurements are repeated. For example, the measurements can be repeated 10-100 times.

The method 400 includes, as shown in box 412, comparing the simulated results to the measured results. The comparison assesses whether the actual behavior of the selected bits corresponds with the predicted behavior of the selected bits.

The method includes, as shown in box 414, determining, based on the comparison, that the semiconductor chip has been fabricated using an altered mask. Although the expected data may or may not match actual data, a significant deviation from what is predicted indicates that the measured features (e.g., gate masks) have been altered, and that the semiconductor chip has been compromised or altered. A user can make the determination based on the comparison.

Figure 5:
FIG. 5 depicts a flow diagram illustrating a method for determining that a semiconductor chip has been altered according to one or more embodiments of the present invention.

FIG. 5 depicts a flow diagram illustrating a method 500 for determining that a semiconductor chip has been altered according to one or more embodiments of the present invention. The method 500 includes, as shown in box 502, providing a semiconductor chip that includes a plurality of SRAM cells. The SRAM cells are fabricated by a trusted agent.

The semiconductor chip is can be any size. Although, the more bits per chip, the more secure the chip design. The semiconductor chip includes a 10 kB to 1 MB SRAM according to exemplary embodiments of the present invention.

The method 500 includes, as shown in box 504, measuring, for each SRAM cell of the plurality of SRAM cells, mask dimensions for a plurality of gates to determine variations dimensions of the plurality of gates. The chip testing device 50 (as shown in FIG. 3) measures the mask dimensions. The mask dimensions can be gate dimensions over active areas. Intentional variation can be added to the gate dimension for example, on secrets bits, to enhance the variations In some embodiments of the present invention, the variations in the gate dimensions can be due to natural, unintended variation that results from imperfect fabrication. In other embodiments of the present invention, the measured variations can be intentional variations. For example, the dimensions over active areas can be intentionally varied in a secret location so that the structure cannot be replicated by an untrusted foundry without being detected during later authentication.

Variation in the measured gate areas for each SRAM cell a unique fingerprint that is not easily replicated. If an untrusted or malicious party were to attempt to fabricate a new mask to match the measured gate variation, the chances of matching each SRAM cell is low.

The method 500 includes, as shown in box 506, simulating the semiconductor chip operation to determine, for each SRAM cell of the plurality of SRAM cells, a probability of being in a state of "0" or "1." The natural variations in the measured gate mask areas result in each SRAM cell having a tendency of being in a state of "0" or "1" after the transistor has been initiated. In other words, each SRAM cell has a probability of being each of "0" and "1," which depends on the measured gate variations within each SRAM cell. Simulations, based on the measured gate mask dimensions, are performed to simulate the semiconductor chip stability and predict the probability of being "0" or "1" after start-up.

Each SRAM cell of the semiconductor chip will have a probability of being "1" after start-up, and a probability of being "0" during start-up. Probabilities of being "1" or "0" are calculated for each bit of the plurality of bits.

As a non-limiting example, a first SRAM cell can have a 90% probability of being "1," and a 10% probability of being "0." A second SRAM cell can have a 50% probability of being "1," and 50% probability of being "0." A third SRAM cell can have a 10% probability of being "1," and a 90% probability of being "0."

The method 500 includes, as shown in box 508, grouping each SRAM cell of the plurality of SRAM cells based on the probability and selecting a subset of SRAM cells to provide simulated results. After turning on the semiconductor chip, the SRAM cells are grouped based on their simulated probabilities. The number of groups can vary and can be a plurality of any number of groups, for example, 2, 3, 4, 5, 6, 7, 8, 9, or 10 groups.

The SRAM cells can be plotted on a probability distribution (see FIG. 7 described above). The x-axis represents a continuum of a high likelihood of being "0" to a high likelihood of being "1," and the y-axis represents the bit count. In some embodiments of the present invention, groups of SRAM cells that are more likely to be "0" or "1" are selected. According to one or more embodiments of the present invention, groups of SRAM cells that have about 65-85% probability of being either "0" or "1" are selected. According to other embodiments of the present invention, groups of SRAM cells that have at least a 65% probability of being either "0" or "1" are selected.

The method 500 includes, as shown in box 510, operating the semiconductor chip and a determining a probability of whether each SRAM cell of the subset of SRAM cells being in the state of "0" or "1" to provide measured results. The semiconductor chip is turned on, and each SRAM cell of the selected subset is measured (by the chip testing device 50, as shown in FIG. 3) to determine whether the SRAM cell is "0" or "1." The measurements are repeated. For example, the measurements can be repeated 10-100 times.

The method 500 includes, as shown in box 512, comparing the simulated results to the measured results. The comparison assesses whether the actual behavior of the selected SRAM cells corresponds with the predicted behavior of the selected SRAM cells.

The method 500 includes, as shown in box 514, determining, based on the comparison, that the semiconductor chip has been altered. Although the expected data may or may not exactly match actual data, a significant deviation from what is predicted indicates that the measured features (e.g., gate masks) have been altered, and that the semiconductor chip has been compromised or altered. A user can make the determination based on the comparison.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which includes one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form described. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There can be many variations to this diagram or the steps (or operations) described therein without departing from the spirit of embodiments of the invention. For instance, the steps can be performed in a differing order or steps can be added, deleted or modified. All of these variations are considered a part of the claimed invention.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method for authenticating a semiconductor chip, the computer-implemented method comprising:
controlling, using a processor, a chip testing unit to measure, for each bit of a plurality of bits in the semiconductor chip, mask dimensions for a feature to determine variations of the feature within each bit;
using the processor to predict based on the variations, for each bit of the plurality of bits, a probability of being "0" or "1" to provide predicated probabilities;
using the processor to group, based on the predicted probabilities, each bit of the plurality of bits and selecting a subset of bits to provide a subset of predicted results;
controlling, using the processor, the chip testing unit to measure each bit of the subset of bits is in a state is "0" or "1" to provide measured results;
using the processor to compare the subset of predicted results and the measured results to provide a comparison; and
using the processor to determine, based on the comparison, that the semiconductor chip has been fabricated using an altered mask.

2. The computer-implemented method of claim 1, wherein the plurality of bits comprises a static random access memory cell.

3. The computer-implemented method of claim 1, wherein the feature comprises a gate mask dimension.

4. The computer-implemented method of claim 1, wherein the feature comprises a gate dimension over an active area.

5. The computer-implemented method of claim 1, wherein the feature comprises a via dimension.

6. The computer-implemented method of claim 1, wherein the feature comprises a metal feature dimension.

7. The computer-implemented method of claim 1, wherein selecting the subset of bits comprises selecting a group of bits with at least 65% probability of being either "0" or "1."

8. A system for authenticating a semiconductor chip, the system comprising:
a processor in communication with one or more types of memory, the processor configured to:
control a chip testing unit to measure, for each bit of a plurality of bits in the semiconductor chip, mask dimensions for a feature to determine variations of the feature within each bit;
predict based on the variations, for each bit of the plurality of bits, a probability of being "0" or "1" to provide predicated probabilities;
group, based on the predicted probabilities, each bit of the plurality of bits and select a subset of bits to provide a subset of predicted results;

control the chip testing unit to measure each bit of the subset of bits is in a state is "0" or "1" to provide measured results;

compare the subset of predicted results to the measured results to provide a comparison; and determine, based on the comparison, that the semiconductor chip has been fabricated using an altered mask.

9. The system of claim 8, wherein the plurality of bits comprises a static random access memory cell.

10. The system of claim 8, wherein the feature comprises a gate mask dimension.

11. The system of claim 8, wherein the feature comprises a gate dimension over an active area.

12. The system of claim 8, wherein the feature comprises a via dimension.

13. The system of claim 8, wherein the feature comprises a metal feature dimension.

14. The system of claim 8, wherein selecting the subset of bits comprises selecting a group of bits with at least 65% probability of being either "0" or "1."

15. A computer program product for authenticating a semiconductor chip, the computer program product comprising:

a computer readable storage medium readable by a processing circuit and storing program instructions for execution by the processing circuit for performing a method comprising:

controlling, using a processor, a chip testing unit to measure, for each bit of a plurality of bits in the semiconductor chip, mask dimensions for a feature to determine variations of the feature within each bit;

using the processor to predict based on the variations, for each bit of the plurality of bits, a probability of being "0" or "1" to provide predicated probabilities;

using the processor to group, based on the predicted probabilities, each bit of the plurality of bits and selecting a subset of bits to provide a subset of predicted results;

controlling, using the processor, the chip testing unit to measure each bit of the subset of bits is in a state is "0" or "1" to provide measured results;

using the processor to compare the subset of predicted results and the measured results to provide a comparison; and using the processor to determine, based on the comparison, that the semiconductor chip has been fabricated using an altered mask.

16. The computer program product of claim 15, wherein the plurality of bits comprises a static random access memory cell.

17. The computer program product of claim 15, wherein the feature comprises a gate mask dimension.

18. The computer program product of claim 15, wherein the feature comprises a gate dimension over an active area.

19. The computer program product of claim 15, wherein the feature comprises a via dimension.

20. The computer program product of claim 15, wherein the feature comprises a metal feature dimension.

\* \* \* \* \*